United States Patent
Udagawa

(10) Patent No.: US 7,508,010 B2
(45) Date of Patent: Mar. 24, 2009

(54) BORON PHOSHIDE-BASED COMPOUND SEMICONDUCTOR DEVICE, PRODUCTION METHOD THEREOF AND LIGHT-EMITTING DIODE

(75) Inventor: Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 10/536,410

(22) PCT Filed: Dec. 1, 2003

(86) PCT No.: PCT/JP03/15349

§ 371 (c)(1),
(2), (4) Date: May 26, 2005

(87) PCT Pub. No.: WO2004/051752

PCT Pub. Date: Jun. 17, 2004

(65) Prior Publication Data

US 2006/0043506 A1     Mar. 2, 2006

Related U.S. Application Data

(60) Provisional application No. 60/432,249, filed on Dec. 11, 2002.

(30) Foreign Application Priority Data

Dec. 2, 2002    (JP)    ............................. 2002-349425

(51) Int. Cl.
*H01L 33/00*    (2006.01)
*H01L 21/00*    (2006.01)

(52) U.S. Cl. ............................. 257/103; 257/79; 257/94; 257/96; 257/99; 257/E33.001; 257/E33.004; 257/E33.005; 438/22; 438/47

(58) Field of Classification Search .................. None
See application file for complete search history.

(56) References Cited

U.S. PATENT DOCUMENTS 5,005,057 A * 4/1991 Izumiya et al. ................ 257/13
5,241,553 A * 8/1993 Tanaka ..................... 372/45.01

(Continued)

FOREIGN PATENT DOCUMENTS

JP    2-288388 A    11/1990

(Continued)

OTHER PUBLICATIONS

Schroten et al. Photo- and electroreflectance of cubic boron phosphide. Feb. 1, 1998. Journal of Applied Physics. vol. 83, No. 3. pp. 1660-1663.*

(Continued)

*Primary Examiner*—Andy Huynh
*Assistant Examiner*—Hoang-Quan T Ho
(74) *Attorney, Agent, or Firm*—Sughrue Mion, PLLC

(57) ABSTRACT

A boron phosphide-based compound semiconductor device with excellent device properties, comprising a boron phosphide-based compound semiconductor layer having a wide bandgap is provided. The boron phosphide-based compound semiconductor layer consists of an amorphous layer and a polycrystal layer provided to join with the amorphous layer, and the room-temperature bandgap of the boron phosphide-based compound semiconductor layer is from 3.0 eV to less than 4.2 eV.

11 Claims, 1 Drawing Sheet

U.S. PATENT DOCUMENTS

| | | | |
|---|---|---|---|
| 6,069,021 A | * | 5/2000 | Terashima et al. ............ 438/46 |
| 6,936,863 B2 | * | 8/2005 | Udagawa et al. ............ 257/103 |
| 2003/0047795 A1 | * | 3/2003 | Udagawa .................... 257/628 |
| 2004/0169184 A1 | | 9/2004 | Udagawa et al. |

FOREIGN PATENT DOCUMENTS

| | | | |
|---|---|---|---|
| JP | 2000-058451 | * | 2/2000 |
| WO | WO 02/097861 A2 | | 12/2002 |
| WO | WO 03/065465 A2 | | 8/2003 |
| WO | WO 2004/047188 A1 | | 6/2004 |

OTHER PUBLICATIONS

Isamu Akasaki (Compiler), "III Zoku Kagobutsu Handoutai", (Group-III Compound Semiconductor), 1st ed., Chap. 13-14, Baifukan, Dec. 8, 1999 pp. 241-255 and pp. 257-273.

Isamu Akasaki (Compiler), "III-V Zoku Kagobutsu Handoutai", (Group III-V Compound Semiconductor), 1st ed., Baifukan, May 20, 1994, pp. 150-151.

Isamu Akasaki (Compiler), "III Zoku Kagobutsu Handoutai", (Group-III Compound Semiconductor), 1st ed., Chap. 6-8, Baifukan, Dec. 8, 1999, pp. 113-125 and pp. 127-146.

"Nippon Kessho Seicho Gakkai Shi", (Journal of Japanese Association of Crystal Growth), vol. 24, No. 2, 1997, p. 150.

K. Shohno, et al, "Epitaxial Growth of BP Compounds on Si Substrates Using the $B_2H_6$-$PH_3$-$H_2$ System", Journal of Crystal Growth, vol. 24/25, 1974, pp. 193-196.

Y. Kumashiro, et al, "Preparation and Electrical Properties of Boron and Boron Phosphide Films Obtained by Gas Source Molecular Beam Deposition", Journal of Solid State Chemistry, vol. 133, 1997, pp. 269-272.

T. Izumiya, et al, "Growth of BP and GaN/BP Heterostructures", Inst. Phys. Conf. Ser., No. 129: Chapter 3, IOP Publishing Ltd., UK (1993), pp. 157-161.

* cited by examiner

BORON PHOSHIDE-BASED COMPOUND SEMICONDUCTOR DEVICE, PRODUCTION METHOD THEREOF AND LIGHT-EMITTING DIODE

CROSS-REFERENCE TO RELATED APPLICATIONS

This application claims the benefit pursuant to 35 U.S.C. §119(e)(1) of U.S. Provisional Application, No. 60/432,249 filed Dec. 11, 2002.

TECHNICAL FIELD

The present invention relates to a boron phosphide-based compound semiconductor device comprising a boron phosphide-based compound semiconductor layer having a wide bandgap at room temperature and also relates to a production method thereof and a light-emitting diode.

BACKGROUND ART

Group-III nitride semiconductors such as gallium nitride (GaN) have been conventionally used for fabricating a nitride semiconductor device such as light-emitting diode (LED) or laser diode (LD) (see, for example, Non-Patent Document 1). The Group-III nitride semiconductor is known to have a relatively wide bandgap at room temperature and, for example, the room-temperature band gap of gallium nitride and aluminum nitride (AlN) having a hexagonal wurtzite structure is as large as 3.4 eV and 5.9 eV, respectively (see, for example, Non-Patent Document 2). Therefore, the Group-III nitride semiconductor layer is used as a functional layer such as clad layer or light-emitting layer of a light-emitting device. The Group-III nitride semiconductor layer having such a large bandgap is advantageous in constituting a junction structure having high barrier. For example, a high mobility transistor comprising a heterojunction of electron supply layer and electron channel layer constituted by using an aluminum gallium nitride mixed crystal ($Al_XGa_{1-X}N$: $0<X\leq 1$) having a bandgap of 3.4 eV or more is disclosed (see, for example, Non-Patent Document 3).

On the other hand, boron phosphide-base compound semiconductors such as boron monophosphide (BP) are known as an indirect Group III-V compound semiconductor.

Unlike Group-III nitride semiconductors such as gallium nitride (GaN), a p-type electrically conducting layer can be readily obtained by intentionally doping an impurity to the boron phosphide-based compound semiconductor. For example, a technique of doping magnesium (Mg) as a p-type impurity to obtain a p-type electrically conducting layer is disclosed (see, for example, Patent Document 1). Accordingly, it is expected that a pn-junction having a barrier difference can be readily obtained by joining a boron phosphide-based compound semiconductor layer having a wide bandgap and a Group-III nitride semiconductor layer.

Here, the room-temperature bandgap of, for example, boron phosphide has been traditionally known to be 2.0 eV (see, for example, Non-Patent Document 2) and in recent years, a technique to obtain a wider room-temperature bandgap from 2.8 to 3.4 eV by the optimization or the like of vapor growth conditions has been developed. However, in order to constitute heterojunction having a barrier height from a boron phosphide-based compound semiconductor layer and a Group-III nitride semiconductor layer such as gallium nitride, the traditional bandgap, 2 eV, given for borron phosphide is insufficient and a boron phosphide-based compound semiconductor layer having a wider bandgap is necessary. A boron phosphide-based compound semiconductor layer having a wide bandgap suitable for constituting heterojunction with a wide-bandgap semiconductor such as Group-III nitride semiconductor has been heretofore not reported.

(Patent Document 1)
JP-A-2-288388 (the term "JP-A" as used herein means an "unexamined published Japanese patent application")
(Non-Patent Document 1)
Isamu Akasaki (compiler), *III Zoku Kagobutsu Handoutai (Group-III Compound Semiconductor)*, 1st ed., Chap. 13-14, Baifukan (Dec. 8, 1999)
(Non-Patent Document 2)
Isamu Akasaki (compiler), *III-V Zoku Kagobutsu Handoutai (Group III-V Compound Semiconductor)*, 1st ed., page 150, Baifukan (May 20, 1994)
(Non-Patent Document 3)
Isamu Akasaki (compiler), *III Zoku Kagobutsu Handoutai (Group-III Compound Semiconductor)*, 1st ed., Chap. 6-8, Baifukan (Dec. 8, 1999)

DISCLOSURE OF INVENTION

The present invention has been made under these circumstances and an object of the present invention is to clarify the constitution of a boron phosphide-based compound semiconductor layer having a bandgap suitable for constituting heterojunction having an appropriate barrier height difference with a Group-III nitride semiconductor such as gallium nitride (GaN) and thereby provide a boron phosphide-based compound semiconductor device with excellent device performance, comprising a boron phosphide-based compound semiconductor layer having a wide bandgap.

As a result of extensive investigations to solve the above-described problems, the present inventors have invented the following boron phosphide-based compound semiconductor device, production method thereof and light-emitting diode.

More specifically, the present invention provides:

(1) a boron phosphide-based compound semiconductor device comprising a boron phosphide-based compound semiconductor layer consisting of an amorphous layer and a polycrystal layer provided to join with the amorphous layer, wherein the room-temperature bandgap of the boron phosphide-based compound semiconductor layer is from 3.0 eV to less than 4.2 eV;

(2) the boron phosphide-based compound semiconductor device as described in (1), wherein the room-temperature bandgap of the polycrystal layer is smaller than the room-temperature bandgap of the amorphous layer;

(3) the boron phosphide-based compound semiconductor device as described in (1) or (2), wherein the polycrystal layer is disposed above the amorphous layer;

(4) the boron phosphide-based compound semiconductor device as described in any one of (1) to (3), wherein both the amorphous layer and the polycrystal layer are an undoped layer not intentionally doped with an impurity;

(5) the boron phosphide-based compound semiconductor device as described in any one of (1) to (4), wherein a Group-III nitride semiconductor layer is provided to join with the boron phosphide-based compound semiconductor layer;

(6) the boron phosphide-based compound semiconductor device as described in (5), wherein the Group-III nitride semiconductor layer comprises a compound represented by the compositional formula $Al_\alpha Ga_\beta In_\gamma N$ (wherein $0\leq\alpha,\beta,\gamma\leq 1$, $\alpha+\beta+\gamma=1$) or $Al_\alpha Ga_\beta In_\gamma N_\delta M_{1-\delta}$ (wherein $0\leq\alpha,\beta,\gamma\leq 1$, $\alpha+\beta+\gamma=1$, $0\leq\delta\leq 1$, and M is a Group-V element except for nitrogen);

(7) the boron phosphide-based compound semiconductor device as described in (6), wherein the boron phosphide-based compound semiconductor layer comprises boron phosphide and the Group-III nitride semiconductor layer comprises gallium nitride;

(8) the boron phosphide-based compound semiconductor device as described in any one of (5) to (7), wherein the boron phosphide-based compound semiconductor layer is a p-type electrically conducting layer, the Group-III nitride semiconductor layer is an n-type electrically conducting layer, and the boron phosphide-based compound semiconductor layer and the Group-III nitride semiconductor layer are joined to constitute a pn-junction structure; and (9) the boron phosphide-based compound semiconductor device as described in any one of (1) to (8), wherein an ohmic-contact or rectifying electrode is provided to join with the boron phosphide-based compound semiconductor layer.

The term "polycrystal layer" as used in the present invention means a layer where an amorphous part and a single crystal part is mixed, or a layer comprising an aggregate of a plurality of columnar single crystals differing in the crystal direction orientation.

The bandgap of the boron phosphide-based compound semiconductor layer can be determined, for example, from the photon energy dependence of imaginary number part of the complex dielectric constant represented by 2·n·k, where n is refractive index and k is extinction coefficient at the same wavelength.

Furthermore, the term "the polycrystal layer is disposed above the amorphous layer" means that after the amorphous layer is formed, the polycrystal layer is formed using the amorphous layer as an underlying layer.

The present invention also provides:

(10) a method for producing a boron phosphide-based compound semiconductor device, which is a method for producing the boron phosphide-based compound semiconductor device described in any one of (1) to (4), the method comprising a step of vapor growth of the amorphous layer at a temperature of 250 to 1,200° C. and a step of vapor growth of the polycrystal layer at a temperature of 750 to 1,200° C.;

(11) the method for producing a boron phosphide-based compound semiconductor device as described in (10), wherein the amorphous layer and the polycrystal layer are vapor-grown at the same temperature and the V/III ratio is set to 0.2 to 50 at the vapor growth of the amorphous layer and to 100 to 500 at the vapor growth of the polycrystal layer; and

(12) the method for producing a boron phosphide-based compound semiconductor device as described in (10) or (11), wherein the vapor growth rate of the amorphous layer is from 50 to 80 nm/min and the vapor growth rate of the polycrystal layer is from 20 to 40 nm/min.

In the present invention, the "V/III ratio" means a ratio of the concentration of Group-III atom such as boron to the concentration of Group-V atom such as phosphorus supplied to the vapor growth region.

Furthermore, the present invention provides:

(13) a light-emitting diode comprising a stacked layer structure obtained by sequentially stacking a lower clad layer, a light-emitting layer and an upper clad layer, wherein the light-emitting layer is a Group-III nitride semiconductor layer and the upper clad layer is a boron phosphide-based compound semiconductor layer comprising an amorphous layer and a polycrystal layer provided to join with the amorphous layer and having a room-temperature bandgap of 3.0 eV to less than 4.2 eV.

THE BEST MODE FOR CARRYING OUT THE INVENTION

Figure 1:
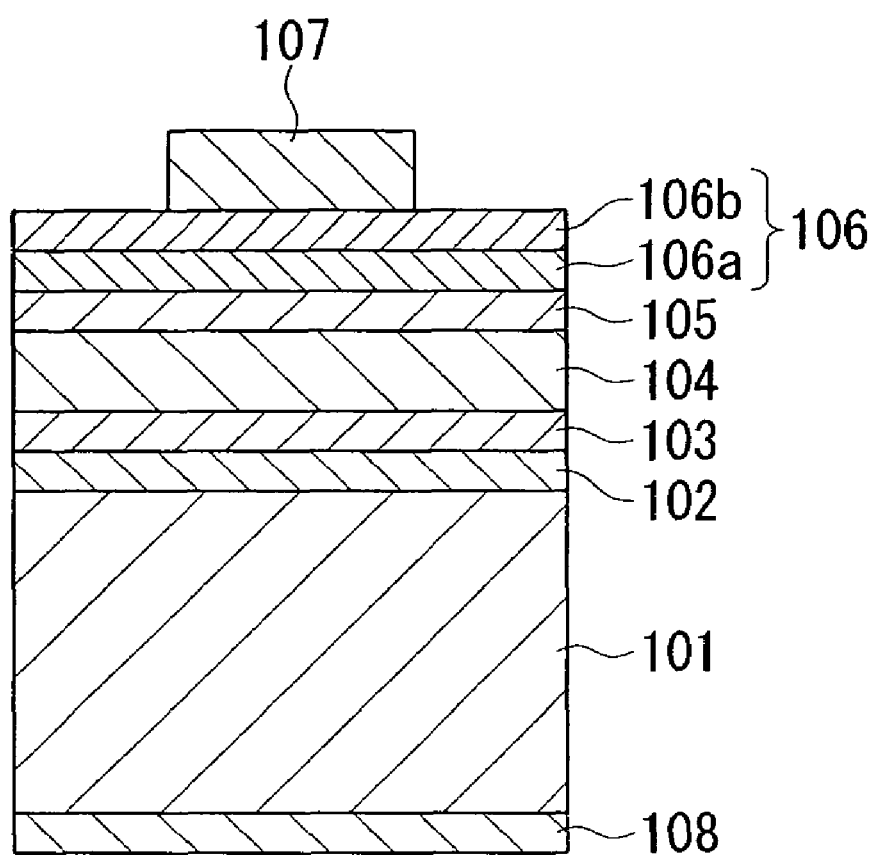
FIG. 1 is a schematic view showing the cross-sectional structure of the pn-junction LED produced in Example according to the present invention.

The present invention is described in detail below.

Boron Phosphide-Based Compound Semiconductor Device

The boron phosphide-based compound semiconductor device of the present invention comprises a boron phosphide-based compound semiconductor layer and the boron phosphide-based compound semiconductor layer comprises an amorphous layer and a polycrystal layer provided to join with the amorphous layer. By employing such a constitution, a boron phosphide-based compound semiconductor device comprising a boron phosphide-based compound semiconductor layer having a wide bandgap such that the bandgap at room temperature is from 3.0 eV to less than 4.2 eV can be provided.

In the present invention, the "boron phosphide-based compound semiconductor" is a cubic zinc-blende crystal structure Group III-V compound semiconductor containing boron (B) and phosphorus (P) and examples thereof include compounds represented by the compositional formulae $B_\alpha Al_\beta Ga_\gamma In_{1-\alpha-\beta-\gamma} P_{1-\delta} As_\delta$ ($0<\alpha\leq 1$, $0\leq\beta<1$, $0\leq\gamma<1$, $0<\alpha+\beta+\gamma\leq 1$, $0\leq\delta<1$) and $B_\alpha Al_\beta Ga_\gamma In_{1-\alpha-\beta-\gamma} P_{1-\delta} N_\delta$ ($0<\alpha\leq 1$, $0\leq\beta<1$, $0\leq\gamma<1$, $0<\alpha+\beta+\gamma\leq 1$, $0\leq\delta<1$). Specific examples thereof include boron monophosphide (BP) and a mixed crystal containing a plurality of Group-V elements, such as boron gallium indium phosphide (compositional formula: $B_\alpha Ga_\gamma In_{1-\alpha-\gamma} P$, wherein $0<\alpha\leq 1$, $0\leq\gamma<1$), boron phosphide nitride (compositional formula: $BP_{1-\delta}N_\delta$, wherein $0\leq\delta<1$) and boron phosphide arsenide (compositional formula: $B_\alpha P_{1-\delta} As_\delta$, wherein $0<\alpha\leq 1$, $0\leq\delta<1$). In particular, the boron monophosphide is preferred because this is a basic structural constituent of boron phosphide-based compound semiconductors. When boron phosphide having a wide bandgap is used as a base material, a boron phosphide-based mixed crystal having a wide bandgap can be obtained.

The boron phosphide-based compound semiconductor layer can be formed by using, as the underlying layer, a crystal substrate such as silicon (Si) crystal, sapphire ($\alpha$-$Al_2O_3$ single crystal), hexagonal or cubic silicon carbide (SiC), or gallium nitride (GaN), or using a Group-III nitride semiconductor layer or the like formed on such a crystalline substrate.

The boron phosphide-based compound semiconductor layer is preferably formed by a vapor growth method such as halogen method (see, *Nippon Kessho Seicho Gakkai Shi (journal of Japanese Association of crystal growth)*, Vol. 24, No. 2, page 150 (1997)), halide method (see, *J. Crystal Growth*, 24/25, pp. 193-196 (1974)), molecular beam epitaxial method (see, *J. Solid State Chem.*, 133, pp. 269-272 (1997)), and metal-organic chemical vapor deposition (MOCVD) method (see, *Inst. Phys. Conf. Ser.*, No. 129, pp. 157-162, IOP Publishing Ltd., UK (1993)). Among these, MOCVD method is preferred because a readily decomposable substance such as triethylborane ($(C_2H_5)_3B$) is used as a boron source and therefore, the amorphous layer can be vapor-grown at a relatively low temperature.

In the present invention, the order of forming the amorphous layer and polycrystal layer constituting the boron phosphide-based compound semiconductor layer is not limited, however, in the case where a large lattice mismatching is present between the material constituting an underlying layer such as crystal substrate and the boron phosphide compound semiconductor, it is preferred to form an amorphous layer and then form a polycrystal layer thereabove to join with the amorphous layer, because the amorphous layer of boron phosphide-based compound semiconductor has a function of relieving the lattice mismatching and therefore, a polycrystal layer free of cracks can be obtained.

In the case of disposing the polycrystal layer on the amorphous layer, the thickness of the amorphous layer is preferably 2 nm or more. If the thickness of the amorphous layer is less than 2 nm, the amorphous layer may not be uniformly grown over the entire surface of an underlying layer so as to homogeneously cover the surface of the underlying layer on which the amorphous layer is deposited. In the boron phosphide-based compound semiconductor device of the present invention, as the thickness of the amorphous layer is larger, the bandgap of the boron phosphide-based compound semiconductor layer is advantageously more widened. For example, when the thickness of the amorphous layer is 50 nm, the room-temperature bandgap of the boron phosphide-based compound semiconductor layer is about 4.2 eV.

The thickness of the amorphous layer or polycrystal layer can be actually measured by using, for example, a high-resolution scanning electron microscope (SEM) for thickness measurement or a transmission electron microscope (TEM).

In the boron phosphide-based compound semiconductor of the present invention, a Group-III nitride semiconductor layer is preferably provided to join with the boron phosphide-based compound semiconductor layer. Examples of the Group-III nitride semiconductor include a compound represented by the compositional formula $Al_\alpha Ga_\beta In_\gamma N$ (wherein $0 \leq \alpha, \beta, \gamma \leq 1$, $\alpha+\beta+\gamma=1$), such as gallium nitride, and a compound represented by the compositional formula $Al_\alpha Ga_\beta In_\gamma N_\delta M_{1-\delta}$ (wherein $0 \leq \alpha, \beta, \gamma \leq 1$, $\alpha+\beta+\gamma=1$, $0<\delta \leq 1$, and M is a Group-V element except for nitrogen).

In the case of a boron phosphide-based compound semiconductor such as boron monophosphide (BP), unlike the Group-III nitride semiconductor, a low-resistive p-type electrically conducting layer can be readily obtained in the as-grown state. On the other hand, in the case of the Group-III nitride semiconductor, an n-type electrically conducting layer can be readily vapor-grown. Accordingly, when an n-type Group-III nitride semiconductor layer is provided to join with a p-type boron phosphide-based compound semiconductor layer, a pn-heterojunction structure having an appropriate barrier height difference can be readily constituted. For example, from a light-emitting layer comprising n-type gallium indium nitride ($Ga_\beta In_\gamma N$: $0 \leq \beta$, $\gamma \leq 1$) having a room-temperature bandgap of about 2.7 eV and a p-type boron phosphide layer having a bandgap of about 3.0 eV, a light-emitting part having a pn-heterojunction structure with a barrier height difference of about 0.3 eV can be constituted. Such a pn-junction structure having a wide-bandgap boron phosphide layer can be suitably used for constituting a pn-junction diode having a high breakdown voltage.

In particular, when the boron phosphide-based compound semiconductor layer comprises boron phosphide and the Group-III nitride semiconductor layer comprises gallium nitride (GaN), a boron phosphide-based compound semiconductor layer having a superior quality can be formed and this is preferred.

The a-axis lattice constant of boron phosphide (BP) having a cubic zinc-blende crystal structure is 0.454 nm and therefore, the lattice spacing on the {111}-crystal plane of boron phosphide is 0.319 nm. On the other hand, the a-axis lattice constant of gallium nitride (GaN) having a wurtzite crystal structure is 0.318 nm. And the a-axis lattice constant of cubic gallium nitride is 0.451 nm. In this way, the lattice spacing on the {111}-crystal plane of boron phosphide substantially agrees with the a-axis lattice constant of wurtzite-structure or cubic gallium nitride. By virtue of such almost no lattice mismatching, a superior crystallinity boron phosphide layer reduced in the density of crystal defects such as misfit dislocation can be grown on the hexagonal or cubic gallium nitride single crystal layer. Therefore, from a boron phosphide layer and a hexagonal or cubic gallium nitride layer, a heterojunction structure capable of preventing the generation of local breakdown can be constituted and this can be suitably used for LED, LD or the like.

When a boron phosphide-based compound semiconductor layer intentionally doped with an impurity is joined with an underlying layer such as Group-III nitride semiconductor layer, the impurity in the boron phosphide-based compound semiconductor layer sometimes diffuses or intrudes into the underlying layer to degrade the electrical properties of the underlying layer. For example, a boron phosphide layer rendered to be a p-type electrically conducting layer by the addition of magnesium (Mg) is formed on a Group-III nitride semiconductor layer comprising an n-type gallium nitride single crystal, the magnesium added diffuses into the n-type gallium nitride single crystal layer to electrically compensate the n-type carrier, as a result, the gallium nitride layer becomes highly resistive.

Therefore, in the present invention, both the amorphous layer and polycrystal layer constituting the boron phosphide-based compound semiconductor layer are preferably constituted by a so-called undoped layer not intentionally doped with an impurity. When the boron phosphide-based compound semiconductor layer is constituted by an undoped layer, a pn-junction structure can be obtained without giving undesired degradation to the underlying layer joined therewith, such as Group-III nitride semiconductor layer, and this is preferred.

An undoped p-type boron phosphide-based compound semiconductor layer can be formed by controlling the vapor growth temperature or the like. For example, in the case of vapor growth of undoped (111)-boron phosphide on the surface of (0.0.0.1.)-gallium nitride single crystal, a p-type electrically conducting layer is readily obtained at a vapor growth temperature exceeding about 1,000° C. and an n-type electrically conducting layer is readily obtained at about 1,000° C. or below.

In the case of a boron phosphide-based compound semiconductor, even in the undoped state, a low-resistive p-type or n-type electrically conducting layer having a carrier concentration of $1 \times 10^{19}$ cm$^{-3}$ or more can be obtained. For example, a p-type electrically conducting layer having a carrier concentration of about $2 \times 10^{19}$ cm$^{-3}$ at room temperature and having a low resistance such that the resistivity (specific resistance) is about $5 \times 10^{-2}$ Ω·cm can be obtained. In particular, when the amorphous layer is vapor-grown at a high temperature exceeding 1,000° C., a boron phosphide-based compound semiconductor layer having low resistance as a whole can be effectively obtained. On such a low-resistive p-type or n-type boron phosphide-based compound semiconductor layer, a good contacting ohmic electrode (ohmic-contact electrode) or a rectifying electrode can be advantageously formed.

The ohmic electrode material may be a material commonly used for an ohmic electrode formed on a Group III-V compound semiconductor layer such as gallium arsenide (GaAs). For example, on the p-type boron phosphide layer, a p-type ohmic electrode comprising a gold alloy (e.g., gold (Au).zinc (Zn), gold (Au).beryllium (Be)) can be formed, and on the n-type boron phosphide layer, an n-type ohmic electrode comprising a gold alloy (e.g., gold (Au).germanium (Ge), gold (Au).tin (Sn), gold (Au).indium (In)) can be formed.

When an ohmic electrode having excellent contact property is formed on the boron phosphide-based compound semiconductor layer, for example, an LED or an LD having a low forward voltage ($V_f$) or a low threshold voltage ($V_{th}$) can be obtained and this is preferred. The ohmic electrode is particularly preferably formed on a boron phosphide-based compound semiconductor layer constituted such that an amorphous layer is disposed below and a polycrystal layer is disposed thereabove. This is because the polycrystal layer has small bandgap at a room temperature as compared with the amorphous layer and an ohmic electrode having superior contact property can be readily obtained. For example, a constitution such that a source or a drain ohmic electrode is disposed to contact with a polycrystal layer smaller in the bandgap can be suitably used for fabricating a high electron mobility MESFET.

As described above, the boron phosphide-based compound semiconductor layer is preferably constituted by disposing an amorphous layer below and disposing a polycrystal layer thereabove, but a reverse constitution may also be employed. A boron phosphide-based compound semiconductor layer constituted by disposing a polycrystal layer and then disposing thereon an amorphous layer larger in the bandgap is suitable for forming a non-rectifying electrode (for example, Schottky contact electrode). The Schottky contact electrode material may be a material commonly used for the Schottky contact electrode formed on a Group III-V compound semiconductor layer, such as aluminum (Al), gold (Au), titanium (Ti), tantalum (Ta) and niobium (Nb).

A constitution such that a Schottky contact electrode is provided on a high-resistive amorphous layer and a polycrystal layer disposed below the amorphous layer is served as an electron supply layer can be suitably used for the fabrication of, for example, a field-effect transistor (MESFET).

Method for Forming Boron Phosphide-Based Compound Semiconductor Layer

The method for forming the boron phosphide-based compound semiconductor layer constituting the boron phosphide-based compound semiconductor device of the present invention is described in detail below.

The amorphous layer and polycrystal layer constituting the boron phosphide-based compound semiconductor layer can be formed by using different vapor growth apparatuses or may be formed by using the same vapor growth apparatus. However, in view of productivity, it is preferred to continuously vapor-grow these layers by using the same vapor growth apparatus.

For example, by using the same vapor growth apparatus, an amorphous layer may be formed at a temperature within the range from 250 to 1,200° C. and subsequently a polycrystal layer may be vapor-grown at a temperature of 750 to 1,200° C. The order of forming the amorphous layer and the polycrystal layer may be reversed. At the formation of amorphous layer, the vapor growth temperature is suitably set to 250° C. or above where the source materials for elements constituting the amorphous layer can be thermal-decomposed sufficiently and the layer formation can proceed. On the other hand, at the layer formation of polycrystal layer, the vapor growth temperature is suitably set to 750° C. or above so as to accelerate the crystallization. In the layer formation of either layer, the vapor growth temperature is suitably 1,200° C. or lower so that the boron phosphide-based compound semiconductor layer comprising boron monophosphide (BP) or a boron phosphide-based compound semiconductor using the boron phosphide can be grown under inhibition of generation of polyhedral boron such as $B_{13}P_2$.

It is also possible to continuously vapor-grow the amorphous layer and the polycrystal layer at the same temperature by using the same vapor growth apparatus. In this case, the supply ratio (V/III ratio) of source materials for elements constituting the boron phosphide-based compound semiconductor is continuously or stepwise changed. By changing the V/III ratio, the amorphous layer and the polycrystal layer can be discriminatingly formed. For example, in the halogen vapor growth method starting from boron trichloride ($BCl_3$) and phosphorus trichloride ($PCl_3$), the V/III ratio can be adjusted by controlling the flow rate of $PCl_3$ to that of $BCl_3$ supplied to the vapor growth region.

In the case of forming an amorphous layer and then forming a polycrystal layer thereabove, this may be attained by forming the amorphous layer at a relatively low V/III ratio and then vapor-growing the polycrystal layer at a V/III ratio higher than that. Conversely, in the case of forming a polycrystal layer and then forming an amorphous layer thereabove, this may be attained by changing the V/III ratio from a high ratio to a low ratio. Furthermore, when the V/III ratio is periodically changed, an amorphous layer and a polycrystal layer can be alternately and periodically formed. The V/III ratio suitable for vapor growth of the amorphous layer is from 0.2 to 50 and the V/III ratio suitable for forming the polycrystal layer is from 100 to 500.

Whether the layer formed is an amorphous layer or a polycrystal layer can be distinguished from a diffraction pattern obtained, for example, by an X-ray diffraction method or an electron beam diffraction method.

The vapor growth rates of the amorphous layer and the polycrystal layer are not particularly limited, but when the growth rate of amorphous layer is higher than the growth rate of polycrystal layer, a boron phosphide-based compound semiconductor layer having a wide bandgap as a whole can be advantageously formed. More specifically, it is preferred to grow the amorphous layer at a rate of 50 to 80 nm/min and grow the polycrystal layer at a rate of 20 to 40 nm/min lower than the rate for the vapor growth of amorphous layer.

The growth rate at the time of vapor growth of the amorphous layer and the polycrystal layer can be adjusted mainly by the supply amount per unit time of the Group-III constituent element such as boron supplied to the vapor growth region. However, in the vapor growth at a temperature exceeding 1,000° C., the growth rate may fluctuate depending on the concentration of phosphorus source in the vapor growth region. Therefore, for the fine adjustment of growth rate in the vapor growth at a high temperature, the amounts of both the Group-III constituent element and the Group-V constituent element supplied to the vapor growth region are preferably adjusted precisely.

For example, at the vapor growth of boron phosphide amorphous layer by an MOCVD method using a reaction system of triethylborane (($C_2H_5$)$_3$B)/phosphine ($PH_3$)/$H_2$, when the amount of the boron source supplied is set to about $2.5 \times 10^{-4}$ mol/min and the amount of the phosphorus source supplied is set to about $5.1 \times 10^{-3}$ mol/min, a growth rate of about 60 nm/min can be obtained at 1,025° C.

In the present invention, the boron phosphide-based compound semiconductor layer is constituted by an amorphous layer and a polycrystal layer provided to join with the amorphous layer and therefore, as described above, a boron phosphide-based compound semiconductor device comprising a boron phosphide-based compound semiconductor layer having a wide band gap such that the room-temperature bandgap is from 3.0 eV to less than 4.2 eV can be provided. In the present invention, the amorphous layer constituting the boron phosphide-based compound semiconductor layer exerts an activity of giving a boron phosphide-based compound semiconductor layer having a large bandgap.

The boron phosphide-based compound semiconductor device comprising a boron phosphide-based compound semiconductor layer having such a wide bandgap of the present invention can be suitably used as LED, LD or the like having a heterojunction structure with a large barrier height difference and having excellent device performances. For example, a boron phosphide-based compound semiconductor layer having a wide bandgap such that the room-temperature bandgap is from 3.0 eV to less than 4.2 eV can be suitably used, in LED or LD, as a clad layer or the like having a barrier difference exceeding 0.3 eV which is sufficiently large to confine the carrier in a light-emitting layer. Furthermore, in LED, the boron phosphide-based compound semiconductor layer can be suitably used as a window layer through which the emission of near ultraviolet light or short-wavelength visible light satisfactorily penetrates to the outside.

The present invention is described below by referring to Examples.

EXAMPLE

As the boron phosphide-based compound semiconductor device of the present invention, a light-emitting diode (LED) having a pn-double heterojunction (DH) structure comprising a boron phosphide-based compound semiconductor layer consisting of an amorphous layer and a polycrystal layer vapor-grown on an Si single crystal substrate was produced. FIG. 1 schematically shows the cross-sectional structure of LED produced.

As the substrate 101, a phosphorus (P)-doped n-type (111)-Si single crystal substrate was used.

First, an undoped boron phosphide (BP) amorphous layer 102 was deposited on the (111)-surface of the substrate 101 by an atmospheric pressure (nearly atmospheric pressure) metal-organic vapor phase epitaxy (MOVPE) method. The boron phosphide amorphous layer 102 was deposited at 450° C. by using triethylborane ($(C_2H_5)_3B$) as the boron source and phosphine ($PH_3$) as the phosphorus source. The ratio ($PH_3/(C_2H_5)_3B$; V/III ratio) of the concentration of phosphorus source supplied to the MOVPE reaction system per unit time to the concentration of boron source was set to 16. The thickness of the boron phosphide amorphous layer 102 was 10 nm.

The supply of the boron source was stopped to terminate the vapor growth of the boron phosphide amorphous layer 102. Thereafter, the temperature of the substrate 101 was elevated to 925° C. in a mixed atmosphere of the phosphorus source ($PH_3$) and hydrogen ($H_2$). Subsequently, the boron source was again flowed and an undoped n-type {111}-boron phosphide single crystal layer 103 was deposited at 925° C. on the boron phosphide amorphous layer 102. The V/III ratio at the vapor growth was set to 1,300. The thickness of the boron phosphide single crystal layer 103 was 120 nm.

On the boron phosphide single crystal layer, a lower clad layer 104 comprising gallium nitride (GaN) single crystal was deposited at 1,050° C. by a hydride VPE method using a gallium (Ga)/ammonia ($NH_3$)/hydrogen ($H_2$) reaction system. The thickness of the lower clad layer was 3 μm.

On the lower clad layer 104, an n-type light-emitting layer 105 comprising n-type gallium indium nitride ($Ga_{0.90}In_{0.10}N$) was vapor-grown at 850° C. by an atmospheric pressure MOCVD method using a trimethylgallium (($CH_3)_3Ga$)/trimethylindium (($CH_3)_3In$)/$H_2$ reaction system. The carrier concentration of the n-type light-emitting layer 105 was $7 \times 10^{17}$ cm$^{-3}$ and the layer thickness was 50 nm.

On the n-type light-emitting layer 105, a boron phosphide amorphous layer 106a was vapor-grown at 1,025° C. by an atmospheric pressure MOCVD method using ($C_2H_5)_3B/PH_3/H_2$ reaction system. The V/III ratio (=$PH_3/(C_2H_5)_3B$) at the vapor growth of the boron phosphide amorphous layer 106a was set to 16 and the boron phosphide amorphous layer 106a was grown at a rate of 50 nm/min. The vapor growth was continued exactly for 30 seconds to form a boron phosphide amorphous layer 106a having a thickness of 25 nm. Immediately, the flow rate of $PH_3$ supplied to the vapor growth region was increased to raise the V/III ratio to 120 and thereby a boron phosphide polycrystal layer 106b was sequentially deposited on the boron phosphide amorphous layer 106a. The boron phosphide polycrystal layer 106b was vapor-grown at a growth rate of 30 nm/min. The thickness of the boron phosphide polycrystal layer was 380 nm. In this way, a p-type boron phosphide layer 106 having a thickness of 405 nm and comprising a two-layer structure of undoped boron phosphide amorphous layer 106a and undoped boron phosphide polycrystal layer 106b was formed.

The carrier concentration of the obtained p-type boron phosphide layer 106 was measured by a conventional Hall effect measurement and found to be about $1 \times 10^{19}$ cm$^{-3}$.

Furthermore, from the photon energy dependence of the product (=$2 \cdot n \cdot k$) of the refractive index (n) and the extinction coefficient (k) measured by a conventional ellipsometer, the room-temperature bandgap of the obtained p-type boron phosphide layer 106 was determined to be about 3.6 eV, revealing that the p-type boron phosphide layer 106 can be suitably used as an upper clad layer of the light-emitting layer 105 and also as a window layer through which the emission from the light-emitting layer 105 satisfactorily penetrates to the outside.

The dislocation density of the obtained p-type boron phosphide layer 106 was measured by a conventional cross-sectional TEM method and found to be less than $1 \times 10^3$/cm$^2$ on average. A region having a dislocation density of $1 \times 10^2$/cm$^2$ or less was also partially present.

In the center part of the p-type boron phosphide layer 106 acting as the upper clad layer, a p-type ohmic electrode 107 having a multilayer structure consisting of an Au.Be alloy (Au 99 mass %.Be 1 mass %) lower layer and an Au upper layer was provided. The p-type ohmic electrode 107 serving also as a pad electrode for wire bonding had a circular shape with a diameter of about 120 μm. On the other hand, an n-type ohmic electrode 108 comprising aluminum (Al).antimony (Sb) alloy was disposed almost throughout the back surface of the substrate 101.

In this way, an LED having a pn-double heterojunction (DH) structure was produced, where the n-type light-emitting layer 105 was sandwiched by the lower clad layer 104 comprising n-type gallium nitride layer and the upper clad layer comprising p-type boron phosphide layer 106.

An operating current of 20 mA was passed in the forward direction between the p-type and the n-type ohmic electrodes 107 and 108 of the obtained LED, as a result, blue band light possessing a wavelength of about 430 nm was emitted. The brightness as chip state was measured by using a conventional integrating sphere and found to be 7 mcd. Furthermore, from the near-field emission pattern, the emission intensity was revealed to be homogeneous over the almost entire surface of the light-emitting layer 105. This is owning to that the ohmic electrode 107 was provided in contact with the p-type boron phosphide layer 106 having the low dislocation density. And therefore, generation of micro luminescent spots due to short-circuit flow of the device operating current through dislocation, which is encountered in conventional techniques, was prevented.

The bandgap of the light-emitting layer 105 was calculated as about 2.9 eV from the emission wavelength and the difference from the bandgap of the p-type boron phosphide layer 106 constituting the upper clad layer was as large as about 0.7 eV. Also, local breakdown did not occur because the ohmic electrode 107 was provided in contact with the p-type boron phosphide layer 106 having the low dislocation density. Accordingly, an LED having good rectification property such that the forward voltage ($V_f$) was about 3V at a forward current of 20 mA and the reverse voltage ($V_r$) was 8 V or above at a reverse current of 10 µm was provided.

As verified above, in this Example, an LED excellent not only in the rectification characteristic but also in the homogeneity of light emission intensity was provided.

INDUSTRIAL APPLICABILITY

According to the present invention, the boron phosphide-based compound semiconductor layer is constituted by an amorphous layer and a polycrystal layer provided to join with the amorphous layer, so that a boron phosphide-based compound semiconductor device with excellent device performances, comprising a boron phosphide-based compound semiconductor layer having a wide bandgap such that the room-temperature bandgap is from 3.0 eV to below than 4.2 eV, can be provided.

The invention claimed is:

1. A boron phosphide-based compound semiconductor device comprising a Group III nitride semiconductor light emitting layer, and a boron phosphide-based compound semiconductor upper cladding layer consisting of an amorphous layer and a polycrystal layer provided to join with the amorphous layer, wherein the Group-III nitride semiconductor layer as the light-emitting layer comprises a compound represented by the compositional formula $Al_\alpha Ga_\beta In\gamma N$ (wherein $0 \leq \alpha, \beta, \gamma \leq 1$, $\alpha+\beta+\gamma=1$) or $Al_\alpha Ga_\beta In_\gamma N_\delta M_{1-\delta}$ (wherein $0 \leq \alpha, \beta, \gamma \leq 1$, $\alpha+\beta+\gamma=1$, $0<\delta \leq 1$, and M is a Group-V element except for nitrogen), and wherein the room-temperature bandgap of the boron phosphide-based compound semiconductor layer is from 3.0 eV to less than 4.2 eV and the polycrystal layer consists of cubic-zincblende crystal structure boron phosphide-based semiconductor.

2. The boron phosphide-based compound semiconductor device according to claim 1, wherein the thicknesses and forming conditions of both the amorphous layer and the polycrystal layer are controlled such that the total band gap of the boron phosphide compound semiconductor layer is within a range of 3.0 to 4.2 eV.

3. The boron phosphide-based compound semiconductor device according to claim 1, wherein the boron phosphide-based polycrystal layer of the upper clad layer is disposed above the boron phosphide-based amorphous layer.

4. The boron phosphide-based compound semiconductor device according to claim 1, wherein the upper clad layer is composed of the amorphous layer and the polycrystal layer, both of which are undoped layers not intentionally doped with an impurity.

5. The boron phosphide-based compound semiconductor device according to claim 1, wherein a Group-III nitride semiconductor layer is provided to join with the boron phosphide-based compound semiconductor upper clad layer.

6. The boron phosphide-based compound semiconductor device according to claim 1, wherein the boron phosphide-based compound semiconductor upper clad layer comprises boron phosphide and the Group-III nitride semiconductor layer comprises gallium nitride.

7. The boron phosphide-based compound semiconductor device according to claim 5, wherein the boron phosphide-based compound semiconductor upper clad layer is a p-type electrically conducting layer, the Group-III nitride semiconductor layer as the light-emitting layer is an n-type electrically conducting layer, and the boron phosphide-based compound semiconductor upper clad layer and the Group-III nitride semiconductor layer are joined to constitute a pn-junction structure.

8. The boron phosphide-based compound semiconductor device according to claim 1, wherein an ohmic-contact or rectifying electrode is provided to join with the boron phosphide-based compound semiconductor upper clad layer.

9. A method for producing a boron phosphide-based compound semiconductor device comprising a boron phosphide-based compound semiconductor layer consisting of an amorphous layer and a polycrystal layer provided to join with the amorphous layer, wherein the room-temperature bandgap of the boron phosphide-based compound semiconductor layer is from 3.0 eV to less than 4.2 eV, the method comprising a step of vapor growth of the amorphous layer at a temperature of 250 to 1,200° C. and a step of vapor growth of the polycrystal layer at a temperature of 750 to 1,200° C., and wherein the vapor growth rate of the amorphous layer is from 50 to 80 nm/min and the vapor growth rate of the polycrystal layer is from 20 to 40 nm/min.

10. The method for producing a boron phosphide-based compound semiconductor device according to claim 9, wherein the amorphous layer and the polycrystal layer are vapor-grown at the same temperature and the V/III ratio is set to 0.2 to 50 at the vapor growth of the amorphous layer and to 100 to 500 at the vapor growth of the polycrystal layer.

11. A light-emitting diode comprising a stacked layer structure obtained by sequentially stacking a lower clad layer, a light-emitting layer and upper clad layers, wherein the light-emitting layer is a Group-III nitride semiconductor layer and the upper clad layers are boron phosphide-based compound semiconductor layers comprising a boron-phosphide based amorphous layer and a boron-phosphide-based polycrystal layer provided to join with the amorphous layer and the upper clad layers having a room-temperature bandgap of 3.0 eV to less than 4.2 eV, and the polycrystal layer consists of cubic zincblende crystal structure boron-phosphide-based compound semiconductor layer, wherein the Group-III nitride semiconductor layer as the light-emitting layer comprises a compound represented by the compositional formula $Al_\alpha Ga_\beta In\gamma N$ (wherein $0 \leq \alpha, \beta, \gamma \leq 1$, $\alpha+\beta+\gamma=1$) or $Al_\alpha Ga_\beta In_\gamma N_\delta M_{1-\delta}$ (wherein $0 \leq \alpha, \beta, \gamma \leq 1$, $\alpha+\beta+\gamma=1$, $0<\delta \leq 1$, and M is a Group-V element except for nitrogen).

* * * * *